United States Patent
Gao

(10) Patent No.: US 8,319,580 B2
(45) Date of Patent: Nov. 27, 2012

(54) ATTENUATOR

(75) Inventor: Cunhao Gao, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 13/307,964

(22) Filed: Nov. 30, 2011

(65) Prior Publication Data

US 2012/0075017 A1 Mar. 29, 2012

Related U.S. Application Data

(63) Continuation of application No. PCT/CN2010/078936, filed on Nov. 22, 2010.

(30) Foreign Application Priority Data

Nov. 20, 2009 (CN) .......................... 2009 1 0109818

(51) Int. Cl.
*H01P 1/22* (2006.01)
*H03F 3/45* (2006.01)
(52) U.S. Cl. ....................... 333/81 R; 333/117; 330/284
(58) Field of Classification Search ............... 333/81 A, 333/81 R, 109, 117; 330/254, 284, 144; 327/237

See application file for complete search history.

(56) References Cited

U.S. PATENT DOCUMENTS

| 3,673,492 | A | 6/1972 | Gilson |
| 5,349,312 | A | 9/1994 | Huettner et al. |
| 7,492,235 | B2 * | 2/2009 | Vice ............................ 333/81 A |
| 2002/0084867 | A1 | 7/2002 | Watanabe |
| 2003/0117216 | A1 | 6/2003 | Villemazet et al. |

FOREIGN PATENT DOCUMENTS

| CN | 2935629 Y | 8/2007 |
| GB | 2236912 A | 4/1991 |
| JP | 2003198273 A | 7/2003 |

OTHER PUBLICATIONS

International Search Report dated Mar. 3, 2011 in connection with International Patent Application No. PCT/CN2010/078936.
Partial Translation of Office Action dated Jul. 27, 2012 in connection with Chinese Patent Application No. 200910109818.6.

* cited by examiner

*Primary Examiner* — Stephen Jones

(57) ABSTRACT

An attenuator includes a first 3 dB bridge, a second 3 dB bridge and an amplifying tube group, where the amplifying tube group includes a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge; where gates of the first amplifying tube and the second amplifying tube are respectively connected to the same voltage source or different voltage sources having the same voltage.

25 Claims, 7 Drawing Sheets

150# ATTENUATOR

CROSS-REFERENCE TO RELATED APPLICATIONS

This application is a continuation of International Application No. PCT/CN2010/078936, filed on Nov. 22, 2010, which claims priority to Chinese Patent Application No. 200910109818.6, filed on Nov. 20, 2009, both of which are hereby incorporated by reference in their entireties.

TECHNICAL FIELD

The present invention relates to the field of electronic communications, and in particular, to an attenuator.

BACKGROUND

An attenuator (for example, a voltage controlled attenuator) is an element applied in a microwave system, and is used for attenuating signal power, so as to control and adjust the output power of the system. If a base station transmits signals at 40 W, the base station can generally cover a circular area with a radius of 2 Km. When the base station detects that a receiving terminal (for example, a mobile phone) is 2 Km away from the base station, the base station transmits signals at full power (that is, 40 W), so that the receiving terminal can receive the signals from the base station. When the base station detects that the receiving terminal is close, for example, only 100 m away from the base station, the base station can reduce the transmission power by adopting an attenuator, for example, the base station can communicate with the receiving terminal by transmitting signals at 2 W, so as to prevent the receiving terminal from being burned out due to excessively high input power.

As shown in FIG. 1, a voltage controlled attenuator in the prior art includes a 3 dB bridge and two PIN diodes.

In the implementation of the present invention, the inventors found that the attenuator in the prior art at least has the following defects.

A voltage-controlled source Vg controls the resistance of the PIN diodes. When the resistance of the PIN diodes is 50Ω, maximum attenuation is achieved. If the resistance of the PIN diodes is near 50Ω, the resistance easily changes slightly due to the device process or high/low temperature, which accelerates variation of the attenuation. The circuit is very sensitive, and the unstable variation of the attenuation results in poor reliability of the circuit.

SUMMARY

Embodiments of the present invention provide an attenuator, which adopts a balancing structure, so that the attenuation increases as the source-drain voltage of the amplifying tube increases, so as to achieve stable variation of the attenuation, thereby improving the reliability of the circuit.

The embodiments of the present invention adopt the following technical solutions.

An attenuator includes a first 3 dB bridge, a second 3 dB bridge and an amplifying tube group, where the amplifying tube group includes a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge;

where the first 3 dB bridge and the second 3 dB bridge are respectively disposed with an isolating resistor used for absorbing power; and gates of the first amplifying tube and the second amplifying tube are respectively connected to the same voltage source or different voltage sources having the same voltage.

A variable gain amplifier includes an attenuator, a first amplifier and a second amplifier, where the attenuator includes a first 3 dB bridge, a second 3 dB bridge and an amplifying tube group, the amplifying tube group includes a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge;

where the first 3 dB bridge and the second 3 dB bridge are respectively disposed with an isolating resistor used for absorbing power;

gates of the first amplifying tube and the second amplifying tube are respectively connected to the same voltage source or different voltage sources having the same voltage; and an input port of the first amplifier is connected to the source of the first amplifying tube of the attenuator, an output port of the first amplifier is connected to the first input port of the second 3 dB bridge of the attenuator, an input port of the second amplifier is connected to the source of the second amplifying tube of the attenuator, and an output port of the second amplifier is connected to the second input port of the second 3 dB bridge of the attenuator.

A communication device includes an attenuator and an amplifier, where the attenuator includes a first 3 dB bridge, a second 3 dB bridge and an amplifying tube group, the amplifying tube group includes a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge;

where the first 3 dB bridge and the second 3 dB bridge are respectively disposed with an isolating resistor used for absorbing power;

gates of the first amplifying tube and the second amplifying tube are respectively connected to the same voltage source or different voltage sources having the same voltage; and the amplifier is configured to amplify signals output by the attenuator.

The above technical solutions have the following advantages.

In the embodiments of the present invention, the 3 dB bridges having a phase difference of 90° and the amplifying tube group are adopted to form a balancing structure, and the sources and the drains of the amplifying tubes are connected in series on signal channels between the two 3 dB bridges, so that the attenuation increases as the impedance of the two amplifying tubes increases, so as to achieve stable variation of the attenuation, thereby improving the reliability of the circuit.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only about some embodiments of the present invention, and person of ordinary skill in the art can derive other drawings from the accompanying drawings without creative efforts.

DETAILED DESCRIPTION

The technical solutions according to the embodiments of the present invention will be clearly and fully described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

Figure 1:
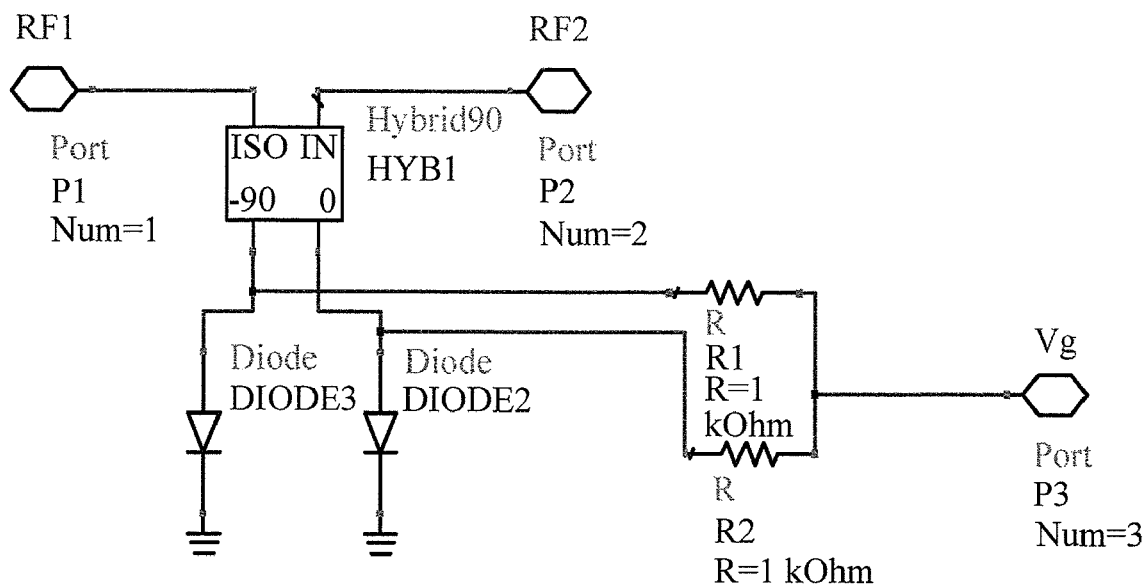
FIG. 1 is a schematic diagram of an attenuator in the prior art.
Figure 2:
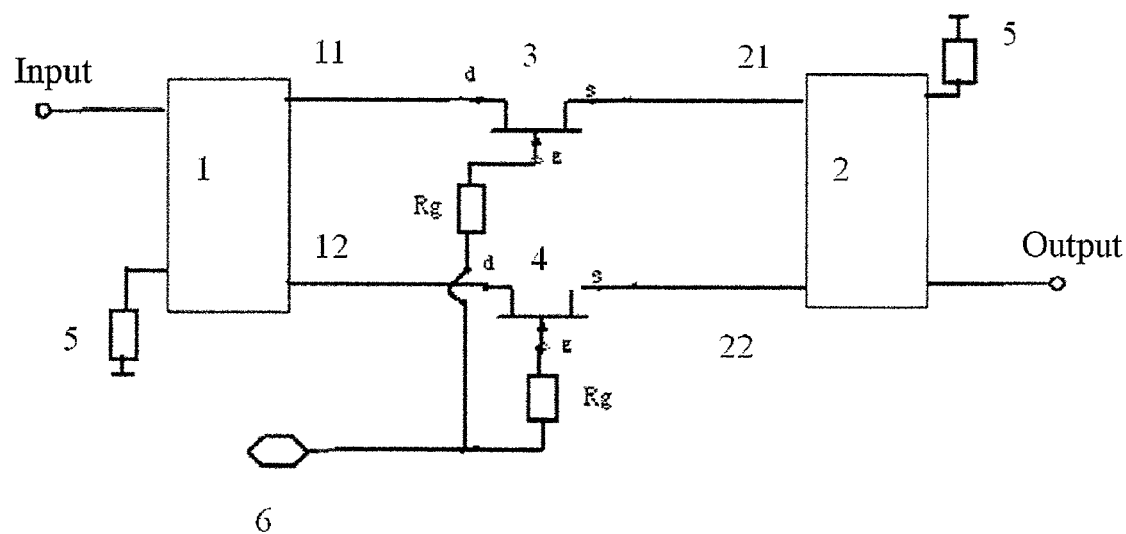
FIG. 2 is a schematic diagram of an embodiment of an attenuator according to the present invention.

As shown in FIG. 2, an embodiment of the present invention provides an attenuator, which includes a first 3 dB bridge 1, a second 3 dB bridge 2 and an amplifying tube group, where the amplifying tube group includes a first amplifying tube 3 and a second amplifying tube 4, a drain of the first amplifying tube 3 is connected to a first output port 11 of the first 3 dB bridge 1, a source of the first amplifying tube 3 is connected to a first input port 21 of the second 3 dB bridge 2, a drain of the second amplifying tube 4 is connected to a second output port 12 of the first 3 dB bridge 1, and a source of the second amplifying tube 4 is connected to a second input port 22 of the second 3 dB bridge 2;

where the first 3 dB bridge 1 and the second 3 dB bridge 2 are respectively disposed with an isolating resistor 5 used for absorbing power; and gates of the first amplifying tube and the second amplifying tube are respectively connected to the same voltage source 6 or different voltage sources having the same voltage.

The first 3 dB bridge may be such an bridge network that when signals are input through an input port, the power of signals output from the first output port is equal to the power of signals output from the second output port, and the phase of the first output port is 90° advanced from that of the second output port, and an isolating resistor is disposed for absorbing power.

The second 3 dB bridge may be such an bridge network that when the power of signals input through the first input port is equal to the power of signals input through the second input port and the phase of the second input port is 90° advanced from that of the first input port, the power of signals output from the output port is a superposition of the power of signals input through the first input port and the power of signals input through the second input port, and an isolating resistor is disposed for absorbing power.

The first 3 dB bridge may be a power divider or coupler disposed with a matching resistor, and the second 3 dB bridge may be a power divider or coupler disposed with a matching resistor. In a chip, the first 3 dB bridge and the second 3 dB bridge may be implemented through a ¼ wavelength microstrip or ¾ wavelength microstrip, for example, a LANGE 3 dB coupler, a two-way equal-split power divider (Wilkinson) with a ¼ wavelength line (or ¾ wavelength line), a power divider of a branch-line structure, and a directional coupler. The frequency corresponding to the wavelength may be a frequency in a working frequency range of the attenuator, for example, the frequency corresponding to the ¼ wavelength line may be a central frequency of the working frequency range. If the working frequency range is 20 to 40 GHZ, the frequency corresponding to the ¼ wavelength line should be designed to be 30 GHZ.

The attenuator may be a voltage controlled attenuator.

In the embodiment of the present invention, the 3 dB bridges having a phase difference of 90° and the amplifying tube group are adopted to form a balancing structure, and the sources and the drains of the amplifying tubes are connected in series on signal channels between the two 3 dB bridges, so that the attenuation increases as the impedance of the two amplifying tubes increases, so as to achieve stable variation of the attenuation, thereby improving the reliability of the circuit.

Figure 3:
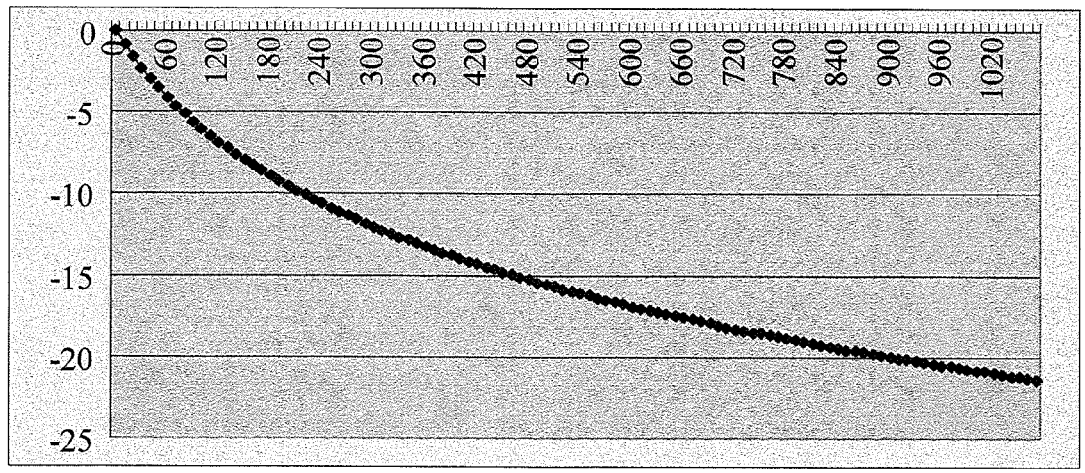
FIG. 3 is a schematic diagram of an attenuation curve of an embodiment of an attenuator according to the present invention.

FIG. 3 is a curve diagram showing a relationship between a source-drain impedance R of the amplifying tube (horizontal axis, unit: Ω) and an attenuation value (longitudinal axis, unit: dB), where the attenuation value increases as the source-drain impedance R of the amplifying tube increases, and the variation is stable.

Further, as the amplifying tubes of two branches have the same characteristics, the gates of the first amplifying tube and the second amplifying tube are respectively connected to the same voltage source or different voltage sources having the same voltage, so that the amplifying tubes have the same voltage to adapt to the 3 dB bridges having a phase difference of 90°. Regardless of the source-drain impedance of the amplifying tube, the impedance of the input port of the attenuator is a matching resistance, which provides good matching.

Further, as the attenuation increases, the signal power may mainly be absorbed by the isolating resistors of the 3 dB bridges, which is conducive to the design of heat dissipation, thereby further improving the reliability of the circuit.

In the above embodiment, further, a resistor may be connected between the gates of the first amplifying tube and the second amplifying tube and the voltage source.

In addition, the "connection" may be electrical connection achieved by direct connection, or electrical connection achieved by connection through other electronic devices. The resistance value of the isolating resistor is a matching resistance value, with accuracy within 40%, for example, the matching resistance is 50Ω in a wireless communication system.

Figure 4:
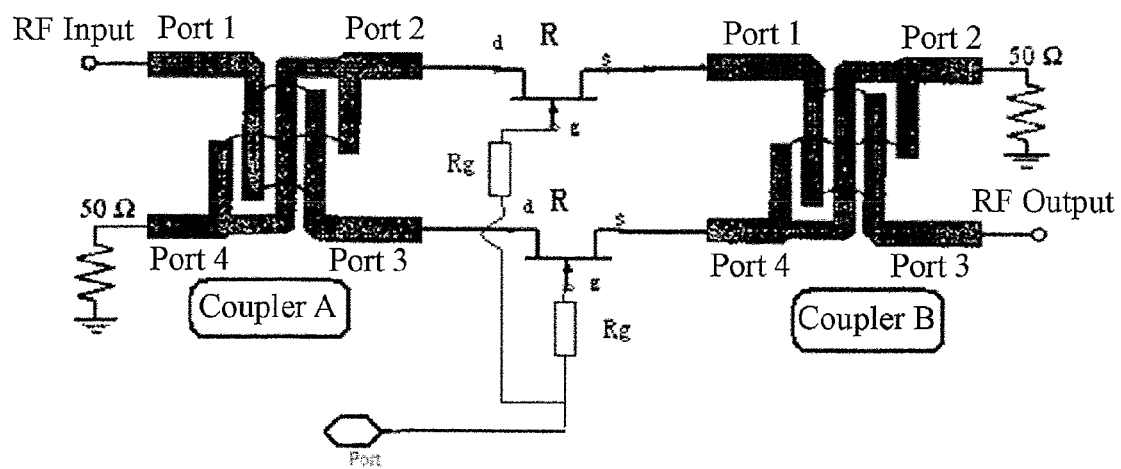
FIG. 4 is a schematic diagram of an attenuator adopting a LANGE coupler according to an embodiment of the present invention.

As shown in FIG. 4, the first 3 dB bridge and the second 3 dB bridge may respectively be two couplers, the first output port is a coupled port (Port 2 in the figure) of a coupler A, the second output port is a straight port (Port 3 in the figure) of the coupler A, and the isolating resistors are connected to isolated ports of the coupler A and the coupler B (Port 4 of the coupler A and Port 2 of a coupler B in the figure); the first input port is a straight port of the coupler B (Port 1 of the coupler B in the figure), and the second input port is a coupled port of the coupler B (Port 4 of the coupler B in the figure).

The attenuation of the attenuator: $S21=20 \log(1-R/(R+2Zo))$, where R is the source-drain impedance of the amplifying tube, and Zo is 50 Ω when the attenuator is applied in a communication system.

The coupler may be a dual-output (or dual-input) equal-split coupler having a phase difference of 90°, for example, a LANGE 3 dB coupler. As shown in FIG. 4, signals are input through Port 1, and Port 2 (the coupled port) and Port 3 (the straight port) have the same power, and have a phase difference of 90°.

As shown in FIG. 4, the power of Port 1 of the left coupler A is equally split into two parts in amplitude, which have a phase difference of 90° when reaching Port 2 and Port 3. If the amplifying tubes on the two signal channels connecting the two couplers do not reflect the power back, Port 4 has no power output. The right coupler B introduces an additional phase shift of 90° so as to enable two output signals to have the same phase again, and then combines the power of the signals. If the amplifying tubes on the two signal channels connecting the two couplers reflect the power back due to unmatched impedances, the signal reflected back by Port 3 of the coupler A and the signal reflected back by Port 1 of the coupler A have a phase difference of 180° and have the same power, the two signals cancel each other, so that the total power is 0, that is, no output power exits; while, for Port 4 of the coupler A, the two reflected signals have a phase difference of 0° and have the same power, so that the two reflected signals are absorbed by the resistance of Port 4. Therefore, when the attenuation increases as the impedance of the two amplifying tubes increases, the signal power is mainly absorbed by the two isolating resistors, which is conducive to the design of heat dissipation, thereby further improving the reliability of the circuit.

As shown in FIG. 4, the coupler A and the coupler B may both be LANGE 3 dB couplers.

Figure 5:
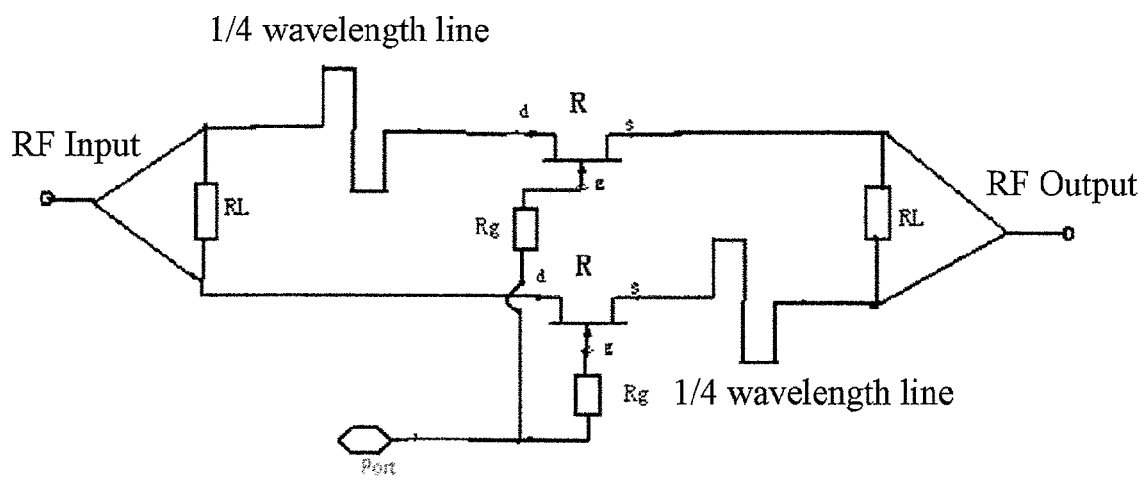
FIG. 5 is a schematic diagram of an attenuator adopting an equal-split power divider according to an embodiment of the present invention.

As shown in FIG. 5, the first 3 dB bridge and the second 3 dB bridge may respectively be two equal-split power dividers. One of two output signals of the left equal-split power divider is connected with a ¼ wavelength line (or ¾ wavelength line), to extend an output signal by ¼ wavelength (or ¾ wavelength), so that when the two output signals reach the drain of the amplifying tube, the signals have a phase difference of 90°; one of two input signals of the right equal-split power divider is connected with another ¼ wavelength line (or ¾ wavelength line), to extend an input signal by ¼ wavelength (or ¾ wavelength), and the two ¼ wavelength lines (or ¾ wavelength lines) are respectively located on the two signal channels connecting the two couplers, so that when the two input signals reach the right equal-split power divider, the signals have the same phase.

Figure 6:
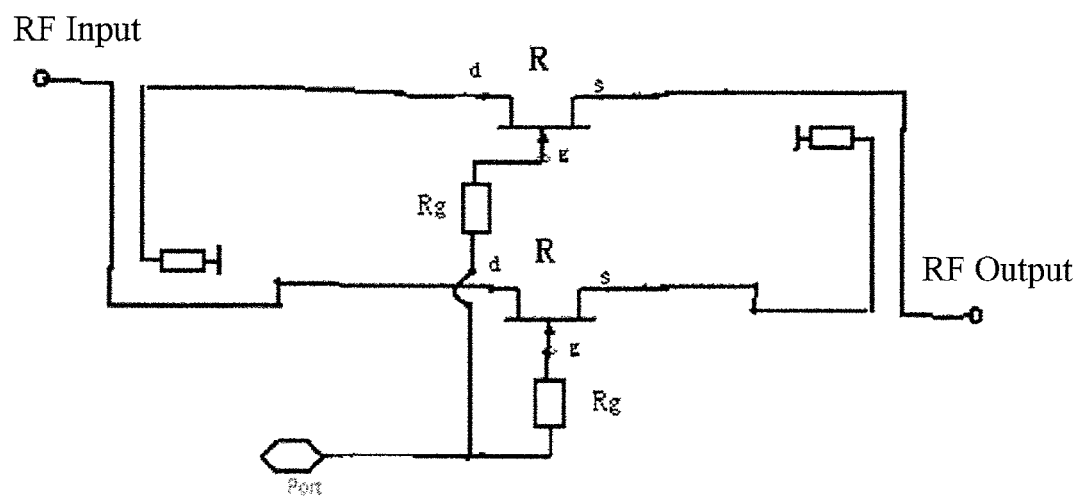
FIG. 6 is a schematic diagram of an attenuator adopting a ¼ wavelength directional coupler according to an embodiment of the present invention.

As shown in FIG. 6, the first 3 dB bridge and the second 3 dB bridge may respectively be two directional couplers, and the ¼ wavelength or ¾ wavelength directional coupler also has the characteristics of dual-output (or dual-input) power equal splitting and a phase difference of 90°.

Figure 7:
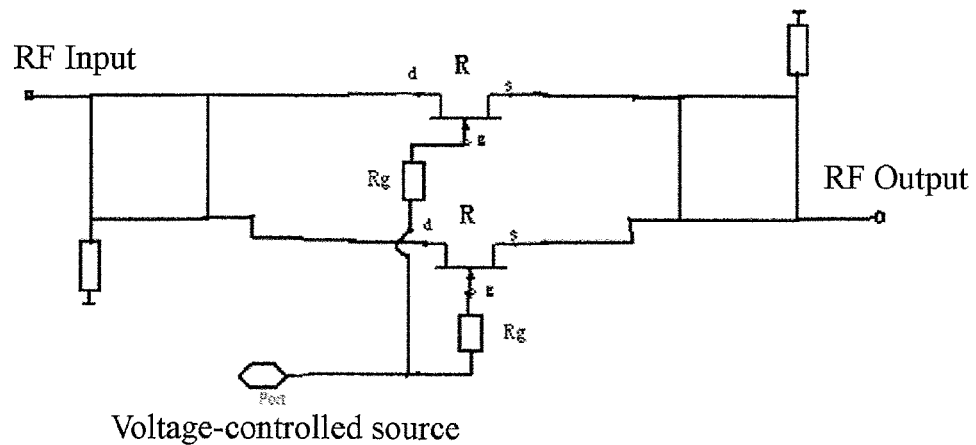
FIG. 7 is a schematic diagram of an attenuator adopting a branch-line structure according to an embodiment of the present invention.

As shown in FIG. 7, the first 3 dB bridge and the second 3 dB bridge may respectively be two power dividers of a branch-line structure.

In the above embodiment, the first 3 dB bridge and the second 3 dB bridge adopt the same circuit form. In addition, the first 3 dB bridge and the second 3 dB bridge may also adopt different circuit forms, for example, the first 3 dB bridge adopts a LANGE 3 dB coupler, and the second 3 dB bridge adopts an equal-split power divider with a ¼ wavelength line or ¾ wavelength line; or, the first 3 dB bridge adopts an equal-split power divider with a ¼ wavelength line or ¾ wavelength line, and the second 3 dB bridge adopts a ¼ wavelength or ¾ wavelength-line directional coupler; or, the first 3 dB bridge adopts a ¼ wavelength or ¾ wavelength-line directional coupler, and the second 3 dB bridge adopts a power divider of a branch-line structure. In the above embodiment, a combination of any two of various circuit implementation forms of the first 3 dB bridge and the second 3 dB bridge may be adopted.

Figure 8:
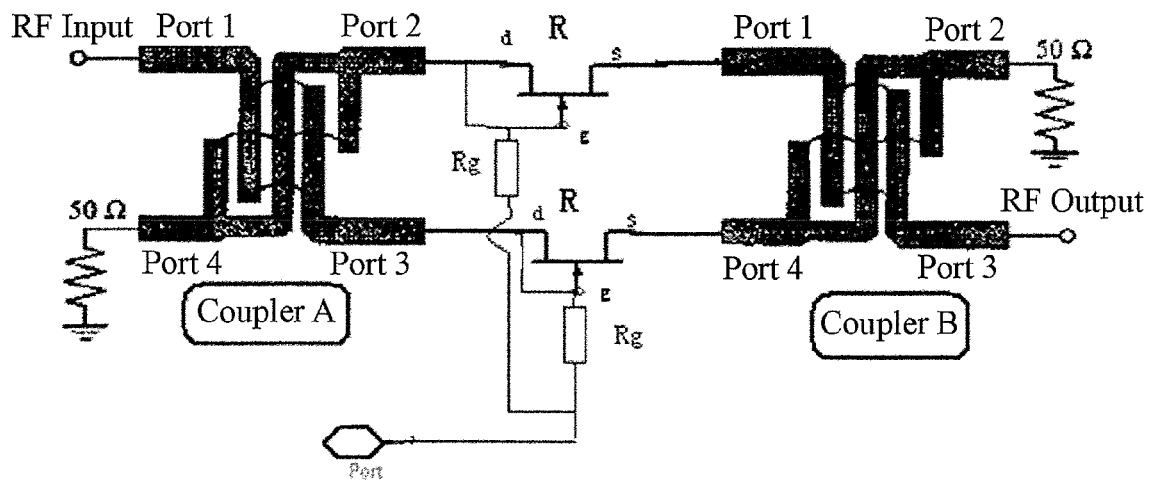
FIG. 8 is a schematic diagram of an attenuator where gates and drains of amplifying tubes are short-circuited according to an embodiment of the present invention.
Figure 9:
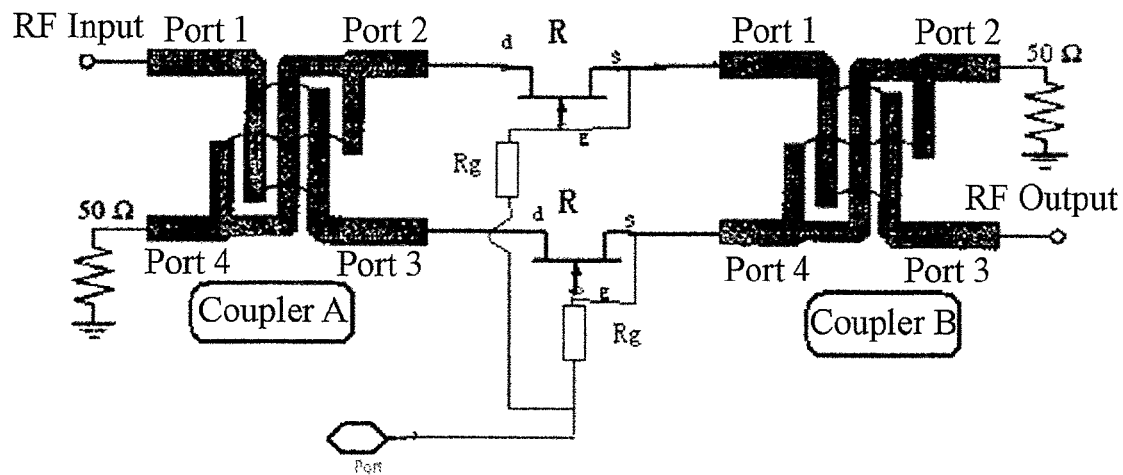
FIG. 9 is a schematic diagram of an attenuator where gates and sources of amplifying tubes are short-circuited according to an embodiment of the present invention.

As shown in FIG. 8 and FIG. 9, in another embodiment of the present invention, the gates, drains and sources of the first amplifying tube and the second amplifying tube may also be connected, for example, referring to FIG. 8, the gate and the drain of the first amplifying tube are short-circuited, and the gate and the drain of the second amplifying tube are short-circuited; and referring to FIG. 9, the gate and the source of the first amplifying tube are short-circuited, and the gate and the source of the second amplifying tube are short-circuited.

Figure 10:
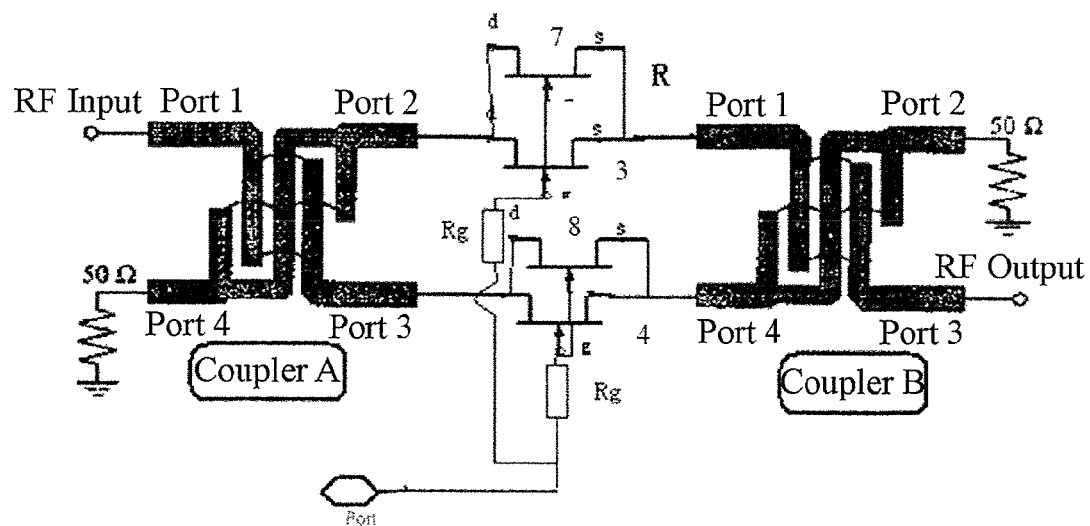
FIG. 10 is a schematic diagram of an attenuator having multiple amplifying tubes connected in parallel according to an embodiment of the present invention.

As shown in FIG. 10, in another embodiment of the present invention, the amplifying tube group may further include a third amplifying tube 7 and a fourth amplifying tube 8. A gate of the third amplifying tube 7 is connected to the gate of the first amplifying tube 3, a source of the third amplifying tube 7 is connected to the source of the first amplifying tube 3, and a drain of the third amplifying tube 7 is connected to the drain of the first amplifying tube 3. A gate of the fourth amplifying tube 8 is connected to the gate of the second amplifying tube 4, a source of the fourth amplifying tube 8 is connected to the source of the second amplifying tube 4, and a drain of the fourth amplifying tube 8 is connected to the drain of the second amplifying tube 4.

It can be seen that, the third amplifying tube is connected in parallel with the first amplifying tube, the fourth amplifying tube is connected in parallel with the second amplifying tube, and the first and second amplifying tubes may be connected in parallel with more amplifying tubes in addition to the third amplifying tube and the fourth amplifying tube. By disposing multiple amplifying tubes connected in parallel on the circuit, the input power is distributed onto the multiple amplifying tubes connected in parallel, which reduces the power borne by a single amplifying tube, thereby increasing the reliability of a single amplifying tube. In addition, as the number of tubes increases, the tubes together can bear a higher total power, thereby increasing the total power that the attenuator can bear.

Figure 11:
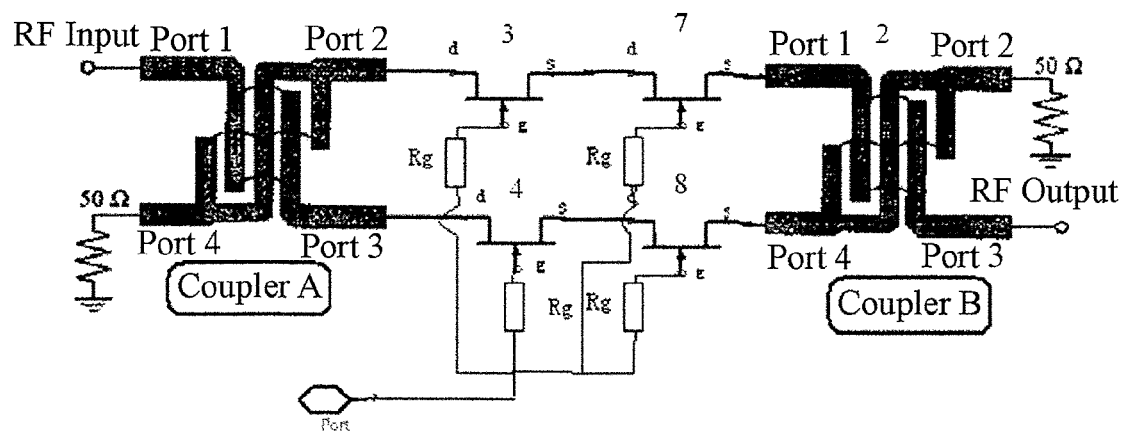
FIG. 11 is a schematic diagram of an attenuator having multiple amplifying tubes connected in series according to an embodiment of the present invention.
Figure 12:
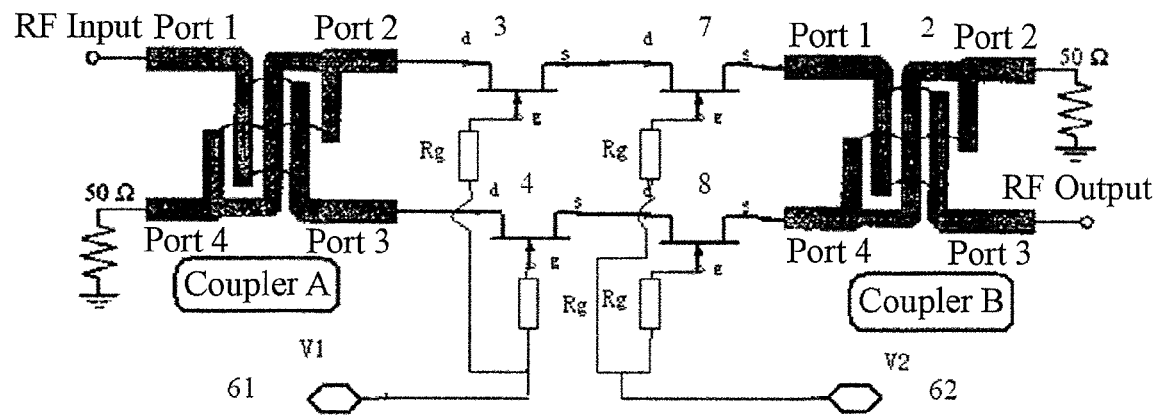
FIG. 12 is a schematic diagram of another attenuator having multiple amplifying tubes connected in series according to an embodiment of the present invention.

As shown in FIG. 11, in another embodiment of the present invention, the third amplifying tube 7 and the fourth amplifying tube 8 may be respectively connected to the first and second amplifying tubes through series connection. As shown in the figure, a drain of the third amplifying tube 7 is connected to the source of the first amplifying tube 3, a source of the third amplifying tube 7 is connected to the first input port of the second 3 dB bridge 2 (Port 1 of the coupler B in the figure), a drain of the fourth amplifying tube 8 is connected to the source of the second amplifying tube 4, a source of the fourth amplifying tube 8 is connected to the second input port of the second 3 dB bridge 2 (Port 4 of the coupler B in the figure), the gates of the first to fourth amplifying tubes may be respectively connected to the same voltage source or different voltage sources having the same voltage, and a resistor may be further connected between the third amplifying tube 7 and the fourth amplifying tube 8 and the voltage source. As shown in FIG. 12, the gates of the first and second amplifying tubes are respectively connected to the same voltage source A61 or different voltage sources having the same voltage, the gates of the third and fourth amplifying tubes are respectively connected to the same voltage source B62 or different voltage sources having the same voltage, and voltage values of the voltage source A and the voltage source B may be different. In addition, the voltage source A61 and the voltage source B62 may be set to different fixed values, different combinations of fixed attenuation values may be obtained by turning on or off the two voltage sources, and the turning on or off of the two voltage sources may be implemented through a digital control circuit that outputs high and low levels.

A resistor may be connected between the third amplifying tube 7 and the fourth amplifying tube 8 and the voltage source B62.

It can be seen that, the third amplifying tube is connected in series with the first amplifying tube, the fourth amplifying tube is connected in series with the second amplifying tube, and the first and second amplifying tubes may be connected in series with more amplifying tubes in addition to the third amplifying tube and the fourth amplifying tube. The attenuation range of the attenuator can be increased by disposing multiple amplifying tubes connected in series on the circuit, for example, if only one amplifying tube is disposed on each of the two signal channels connecting the two couplers and the attenuation range is only 10 dB, the overall attenuation range is 20 dB after one more amplifying tube is connected in series, and the overall attenuation range is a superposition of the attenuation ranges of the two amplifying tubes.

Figure 13:
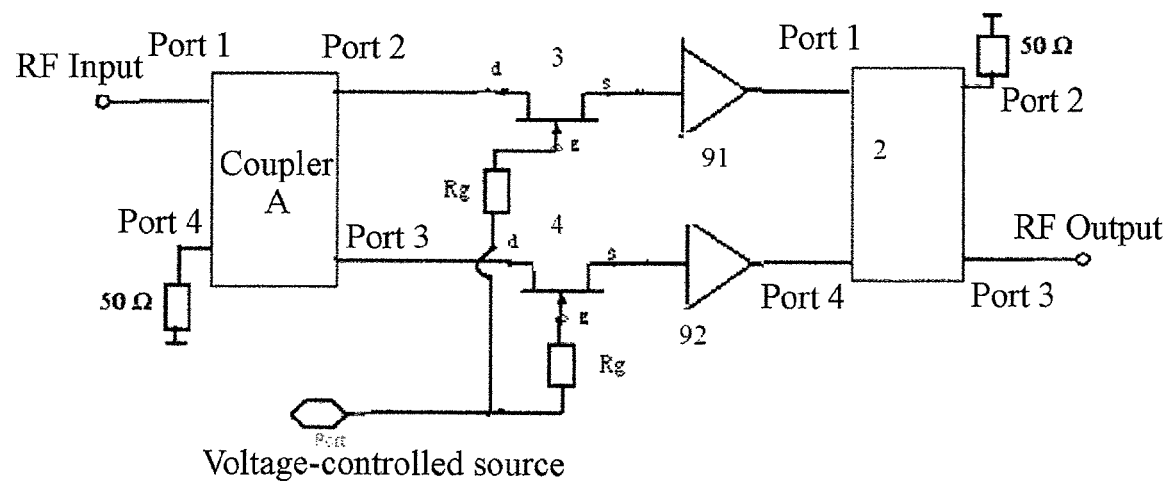
FIG. 13 is a schematic diagram of an embodiment of a variable gain amplifier according to the present invention.

As shown in FIG. 13, the present invention further provides an embodiment of a variable gain amplifier, where the variable gain amplifier includes an attenuator, a first amplifier 91 and a second amplifier 92. The attenuator is the attenuator in the above embodiments, and thus will not be introduced herein again.

An input port of the first amplifier 91 is connected to the source of the first amplifying tube 3 of the attenuator, an output port of the first amplifier 91 is connected to the first input port (Port 1 in the figure) of the second 3 dB bridge 2 of the attenuator, an input port of the second amplifier 92 is connected to the source of the second amplifying tube 4 of the attenuator, and an output port of the second amplifier 92 is connected to the second input port (Port 4 in the figure) of the second 3 dB bridge 2 of the attenuator.

By adding amplifiers with constant gains on two signal channels connecting the two 3 dB bridges, and by adjusting the attenuation of the attenuator, the gain of the whole circuit changes, thereby achieving a variable gain amplifier.

Figure 14:
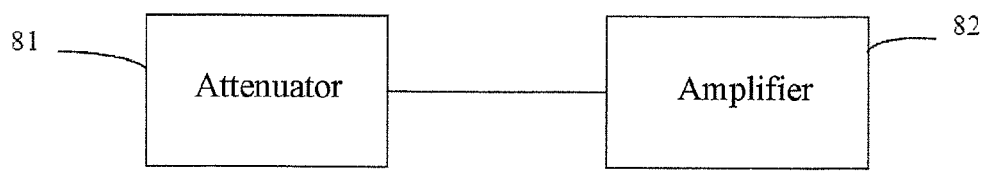
FIG. 14 is a schematic diagram of an embodiment of a communication device according to the present invention.

As shown in FIG. 14, the present invention further provides an embodiment of a communication device, where the communication device includes an attenuator 81 and an amplifier 82. The attenuator is the attenuator in the above embodiments, and thus will not be introduced herein again.

The amplifier 82 is configured to amplify signals output by the attenuator.

The communication device may be a Global System of Mobile communications (GSM) base station, a Wideband Code Division Multiple Access (WCDMA) base station, a Long Term Evolution (LTE) base station, a Time Division-Synchronous Code Division Multiple Access (TD-SCDMA) base station, a communication terminal (for example, a mobile phone terminal), a radio station, a radar, or a point-to-point communication system (for example, an OutDoor Unit (ODU)).

Only several embodiments of the present invention have been illustrated above. Those skilled in the art can make various modifications and variations to the present invention according to the disclosure of the application document without departing from the spirit and scope of the present invention.

What is claimed is:

1. An attenuator, comprising a first 3 dB bridge, a second 3 dB bridge and an amplifying tube group, wherein the amplifying tube group comprises a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge;

wherein the first 3 dB bridge and the second 3 dB bridge are respectively disposed with an isolating resistor used for absorbing power; and gates of the first amplifying tube and the second amplifying tube are respectively connected to the same voltage source or different voltage sources having the same voltage.

2. The attenuator according to claim 1, wherein the first 3 dB bridge or the second 3 dB bridge is a power divider or coupler.

3. The attenuator according to claim 2, wherein the power divider or coupler is implemented through a ¼ wavelength microstrip or ¾ wavelength microstrip.

4. The attenuator according to claim 2, wherein the first 3 dB bridge and the second 3 dB bridge are respectively a first coupler and a second coupler, the first output port is a coupled port of the first coupler, the second output port is a straight port of the first coupler, and the isolating resistor is connected to isolated ports of the first coupler and the second coupler; and the first input port is a straight port of the second coupler, and the second input port is a coupled port of the second coupler.

5. The attenuator according to claim 4, wherein the first coupler or the second coupler is a LANGE 3 dB coupler.

6. The attenuator according to claim 2, wherein the first 3 dB bridge or the second 3 dB bridge is an equal-split power divider with a ¼ wavelength line or ¾ wavelength line.

7. The attenuator according to claim 2, wherein the first 3 dB bridge or the second 3 dB bridge is a directional coupler.

8. The attenuator according to claim 2, wherein the first 3 dB bridge or the second 3 dB bridge is a power divider of a branch-line structure.

9. The attenuator according to claim 1, wherein the gate and the drain of the first amplifying tube are short-circuited, and the gate and the drain of the second amplifying tube are short-circuited; or, the gate and the source of the first amplifying tube are short-circuited, and the gate and the source of the second amplifying tube are short-circuited.

10. The attenuator according to claim 1, wherein the amplifying tube group further comprises a third amplifying tube and a fourth amplifying tube, a gate of the third amplifying tube is connected to the gate of the first amplifying tube, a source of the third amplifying tube is connected to the source of the first amplifying tube, a drain of the third amplifying tube is connected to the drain of the first amplifying tube, a gate of the fourth amplifying tube is connected to the gate of the second amplifying tube, a source of the fourth amplifying tube is connected to the source of the second amplifying tube, and a drain of the fourth amplifying tube is connected to the drain of the second amplifying tube.

11. The attenuator according to claim 1, wherein the amplifying tube group further comprises a third amplifying tube and a fourth amplifying tube, a drain of the third amplifying tube is connected to the source of the first amplifying tube, a source of the third amplifying tube is connected to the first input port of the second 3 dB bridge, a drain of the fourth amplifying tube is connected to the source of the second amplifying tube, a source of the fourth amplifying tube is connected to the second input port of the second 3 dB bridge, the gates of the first amplifying tube and the second amplifying tube are respectively connected to the same voltage source or different voltage sources having the same voltage, and gates of the third amplifying tube and the fourth amplifying tube are respectively connected to the same voltage source or different voltage sources having the same voltage.

12. The attenuator according to claim 1, wherein the amplifying tube group further comprises a third amplifying tube and a fourth amplifying tube, a drain of the third amplifying tube is connected to the source of the first amplifying tube, a source of the third amplifying tube is connected to the first input port of the second 3 dB bridge, a drain of the fourth amplifying tube is connected to the source of the second amplifying tube, a source of the fourth amplifying tube is connected to the second input port of the second 3 dB bridge, and gates of the first to fourth amplifying tubes are respectively connected to the same voltage source or different voltage sources having the same voltage.

13. The attenuator according to claim 1, wherein a resistance value of the isolating resistor is a matching resistance value, with accuracy within 40%.

14. A variable gain amplifier, comprising an attenuator, a first amplifier and a second amplifier,
the attenuator comprises a first 3 dB bridge, a second 3 dB bridge and an amplifying tube group, wherein the amplifying tube group comprises a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge;
wherein the first 3 dB bridge and the second 3 dB bridge are respectively disposed with an isolating resistor used for absorbing power; and
gates of the first amplifying tube and the second amplifying tube are respectively connected to the same voltage source or different voltage sources having the same voltage;
and wherein an input port of the first amplifier is connected to the source of the first amplifying tube of the attenuator, an output port of the first amplifier is connected to the first input port of the second 3 dB bridge of the attenuator, an input port of the second amplifier is connected to the source of the second amplifying tube of the attenuator, and an output port of the second amplifier is connected to the second input port of the second 3 dB bridge of the attenuator.

15. The attenuator according to claim 14, wherein the first 3 dB bridge or the second 3 dB bridge is a power divider or coupler.

16. The attenuator according to claim 14, wherein the gate and the drain of the first amplifying tube are short-circuited, and the gate and the drain of the second amplifying tube are short-circuited; or, the gate and the source of the first amplifying tube are short-circuited, and the gate and the source of the second amplifying tube are short-circuited.

17. The attenuator according to claim 14, wherein the amplifying tube group further comprises a third amplifying tube and a fourth amplifying tube, a gate of the third amplifying tube is connected to the gate of the first amplifying tube, a source of the third amplifying tube is connected to the source of the first amplifying tube, a drain of the third amplifying tube is connected to the drain of the first amplifying tube, a gate of the fourth amplifying tube is connected to the gate of the second amplifying tube, a source of the fourth amplifying tube is connected to the source of the second amplifying tube, and a drain of the fourth amplifying tube is connected to the drain of the second amplifying tube.

18. The attenuator according to claim 14, wherein the amplifying tube group further comprises a third amplifying tube and a fourth amplifying tube, a drain of the third amplifying tube is connected to the source of the first amplifying tube, a source of the third amplifying tube is connected to the first input port of the second 3 dB bridge, a drain of the fourth amplifying tube is connected to the source of the second amplifying tube, a source of the fourth amplifying tube is connected to the second input port of the second 3 dB bridge, the gates of the first amplifying tube and the second amplifying tube are respectively connected to the same voltage source or different voltage sources having the same voltage, and gates of the third amplifying tube and the fourth amplifying tube are respectively connected to the same voltage source or different voltage sources having the same voltage.

19. The attenuator according to claim 14, wherein the amplifying tube group further comprises a third amplifying tube and a fourth amplifying tube, a drain of the third amplifying tube is connected to the source of the first amplifying tube, a source of the third amplifying tube is connected to the first input port of the second 3 dB bridge, a drain of the fourth amplifying tube is connected to the source of the second amplifying tube, a source of the fourth amplifying tube is connected to the second input port of the second 3 dB bridge, and gates of the first to fourth amplifying tubes are respectively connected to the same voltage source or different voltage sources having the same voltage.

20. A communication device, comprising an attenuator and an amplifier,
the attenuator comprises a first 3 dB bridge, a second 3 dB bridge and an amplifying tube group, wherein the amplifying tube group comprises a first amplifying tube and a second amplifying tube, a drain of the first amplifying tube is connected to a first output port of the first 3 dB bridge, a source of the first amplifying tube is connected to a first input port of the second 3 dB bridge, a drain of the second amplifying tube is connected to a second output port of the first 3 dB bridge, and a source of the second amplifying tube is connected to a second input port of the second 3 dB bridge;

wherein the first 3 dB bridge and the second 3 dB bridge are respectively disposed with an isolating resistor used for absorbing power; and gates of the first amplifying tube and the second amplifying tube are respectively connected to the same voltage source or different voltage sources having the same voltage;

and wherein the amplifier is configured to amplify signals output by the attenuator.

21. The attenuator according to claim 20, wherein the first 3 dB bridge or the second 3 dB bridge is a power divider or coupler.

22. The attenuator according to claim 20, wherein the gate and the drain of the first amplifying tube are short-circuited, and the gate and the drain of the second amplifying tube are short-circuited; or, the gate and the source of the first amplifying tube are short-circuited, and the gate and the source of the second amplifying tube are short-circuited.

23. The attenuator according to claim 20, wherein the amplifying tube group further comprises a third amplifying tube and a fourth amplifying tube, a gate of the third amplifying tube is connected to the gate of the first amplifying tube, a source of the third amplifying tube is connected to the source of the first amplifying tube, a drain of the third amplifying tube is connected to the drain of the first amplifying tube, a gate of the fourth amplifying tube is connected to the gate of the second amplifying tube, a source of the fourth amplifying tube is connected to the source of the second amplifying tube, and a drain of the fourth amplifying tube is connected to the drain of the second amplifying tube.

24. The attenuator according to claim 20, wherein the amplifying tube group further comprises a third amplifying tube and a fourth amplifying tube, a drain of the third amplifying tube is connected to the source of the first amplifying tube, a source of the third amplifying tube is connected to the first input port of the second 3 dB bridge, a drain of the fourth amplifying tube is connected to the source of the second amplifying tube, a source of the fourth amplifying tube is connected to the second input port of the second 3 dB bridge, the gates of the first amplifying tube and the second amplifying tube are respectively connected to the same voltage source or different voltage sources having the same voltage, and gates of the third amplifying tube and the fourth amplifying tube are respectively connected to the same voltage source or different voltage sources having the same voltage.

25. The attenuator according to claim 20, wherein the amplifying tube group further comprises a third amplifying tube and a fourth amplifying tube, a drain of the third amplifying tube is connected to the source of the first amplifying tube, a source of the third amplifying tube is connected to the first input port of the second 3 dB bridge, a drain of the fourth amplifying tube is connected to the source of the second amplifying tube, a source of the fourth amplifying tube is connected to the second input port of the second 3 dB bridge, and gates of the first to fourth amplifying tubes are respectively connected to the same voltage source or different voltage sources having the same voltage.

* * * * *